(12) United States Patent
Chen et al.

(10) Patent No.: US 8,651,025 B2
(45) Date of Patent: Feb. 18, 2014

(54) OVERHEAD HOIST TRANSPORT SYSTEM

(75) Inventors: Tsan-I Chen, Taoyuan County (TW); Wen-Yu Fang, New Taipei (TW)

(73) Assignee: Inotera Memories, Inc., Taoyuan County (TW)

( * ) Notice: Subject to any disclaimer, the term of this patent is extended or adjusted under 35 U.S.C. 154(b) by 221 days.

(21) Appl. No.: 13/285,033

(22) Filed: Oct. 31, 2011

(65) Prior Publication Data
US 2013/0061772 A1 Mar. 14, 2013

(30) Foreign Application Priority Data
Sep. 8, 2011 (TW) .............................. 100132411 A

(51) Int. Cl.
*B61B 3/02* (2006.01)
(52) U.S. Cl.
USPC .......................................................... 104/96
(58) Field of Classification Search
USPC ............ 104/91, 94, 96, 105, 130.01, 130.07; 105/148, 155
See application file for complete search history.

(56) References Cited

U.S. PATENT DOCUMENTS

| | | | | |
|---|---|---|---|---|
| 3,913,491 | A | * | 10/1975 | Auer et al. ................ 104/130.07 |
| 2005/0011398 | A1 | * | 1/2005 | Owens ............................ 104/94 |
| 2005/0139114 | A1 | * | 6/2005 | Nakao et al. .................... 104/96 |
| 2007/0000405 | A1 | * | 1/2007 | Nakao ...................... 104/130.07 |

\* cited by examiner

*Primary Examiner* — S. Joseph Morano
*Assistant Examiner* — Zachary Kuhfuss
(74) *Attorney, Agent, or Firm* — Rosenberg, Klein & Lee

(57) ABSTRACT

An overhead wafer transport system includes an over head transportation (OHT) rail and at least one shuttle. The OHT rail includes a main track and two lateral tracks, each having a hollow transverse cross-section, each lateral track being in corresponding connection with the main track through the two sides thereof, constituting an approximate tri-directional branch form. The shuttle has a track-interface assembly and a docking unit, the track-interface assembly being adapted to travel along the OHT rail. The track-interface assembly being arranged at the junction of the two lateral tracks and the main track, wherein the track-interface assembly is adapted to selectively travel along at least one of the main track and the lateral tracks. Therefore, the overhead wafer transport system can be applied to a clean room with higher transfer efficiency and clean room space utilization.

7 Claims, 14 Drawing Sheets

OVERHEAD HOIST TRANSPORT SYSTEM

BACKGROUND OF THE INVENTION

1. Field of the Invention

The present invention relates to overhead hoist transport system; in particular, to overhead hoist wafer transport system.

2. Description of Related Art

Semi-conductor fabrication plant (fabs) usually own production tools to manufacture semi-conductor wafers, for example, processes such as exposure, etching, diffusing and ion implant, grinding through chemical machines or thin film deposition. During the process of manufacturing, the wafers will be transported to different production units (also known as BAY) to undergo corresponding manufacturing process, or remain in the same production unit to undergo different manufacturing process in different stages. Therefore, semi-conductor fabs usually make use of the auto-transportation system to assist in transporting the wafers to different production units throughout different stages of manufacturing.

Please refer to FIG. 1A, which shows a common arrangement of a conventional overhead hoist transport (OHT) system. The overhead track 1 usually comprise a main track 11 and a lateral track 12 furcated from the main track 11, forming a Y-shaped rail segment. A shuttle 2 travels on the aforementioned tracks to transport wafers, and the shuttle 2 has to go round the production tool 3" in order to transport the wafers from tool 3 to tool 3'.

Additionally, as shown in FIG. 1B, in a semi-conductor fab, production tools are move-in/out very often to meet a new process or product need, or in cases where more production tools are needed due to the increase of production, thus the position of the track 1, the OHT rail of the prior art, and the production tool have resulted a waste in space in the clean room, hence the clean room are expanded to meet the needs, likewise increasing the cost.

If the OHT rail in FIG. 1B is replaced by the OHT rail in FIG. 1C, one more production tool may fit in the very limited clean room space, but the shuttle 2 will have to travel a longer distance whenever the shuttle 2 transports the wafers from tool 4 to tool 4', hence wasting more time in traveling during production stages, resulting a lower transfer efficiency.

Due to these reasons, the inventors believe these defects can be improved, and through research and application of the academic studies, eventually a design is proposed which effectively modifies the aforementioned defects.

SUMMARY OF THE INVENTION

The objects of the present invention are to achieve better clean room space utilization and transfer efficiency by using the overhead wafer transport system.

In order to achieve the aforementioned objects, the present invention designs an overhead wafer transport system which comprises an overhead transportation (OHT) rail and at least one shuttle. The OHT rail includes a main track and two lateral tracks, each having a hollow transverse cross-section, each lateral track being in corresponding connection with the main track through the two sides thereof. The shuttle has a track-interface assembly and a docking unit, the track-interface assembly being adapted to travel along the OHT rail; wherein the track-interface assembly being arranged at the junction of the two lateral tracks and the main track, wherein the track-interface assembly is adapted to selectively travel along at least one of the main track and lateral tracks.

The OHT rail in the present invention comprises a rail segment similar to a tip section of a trident, with the two lateral tracks connecting to the corresponding two sides of the main track. This arrangement helps to achieve better clean room space utilization and appropriate placing of the tracks and the production tools can also help to achieve higher transfer efficiency of the semi-conductor wafers.

In conclusion, the advantages of the present invention are as follow: according to the implementation examples from the present invention, the present inventions can achieve better clean room space utilization and transfer efficiency of the wafers in comparison to the overhead wafer transport system of the prior arts.

In order to further the understanding regarding the present invention, the following embodiments are provided along with illustrations to facilitate the disclosure of the present invention.

DETAILED DESCRIPTION OF THE PREFERRED EMBODIMENTS

The aforementioned illustrations and following detailed descriptions are exemplary for the purpose of further explaining the scope of the present invention. Other objectives and advantages related to the present invention will be illustrated in the subsequent descriptions and appended drawings.

Figure 1A:
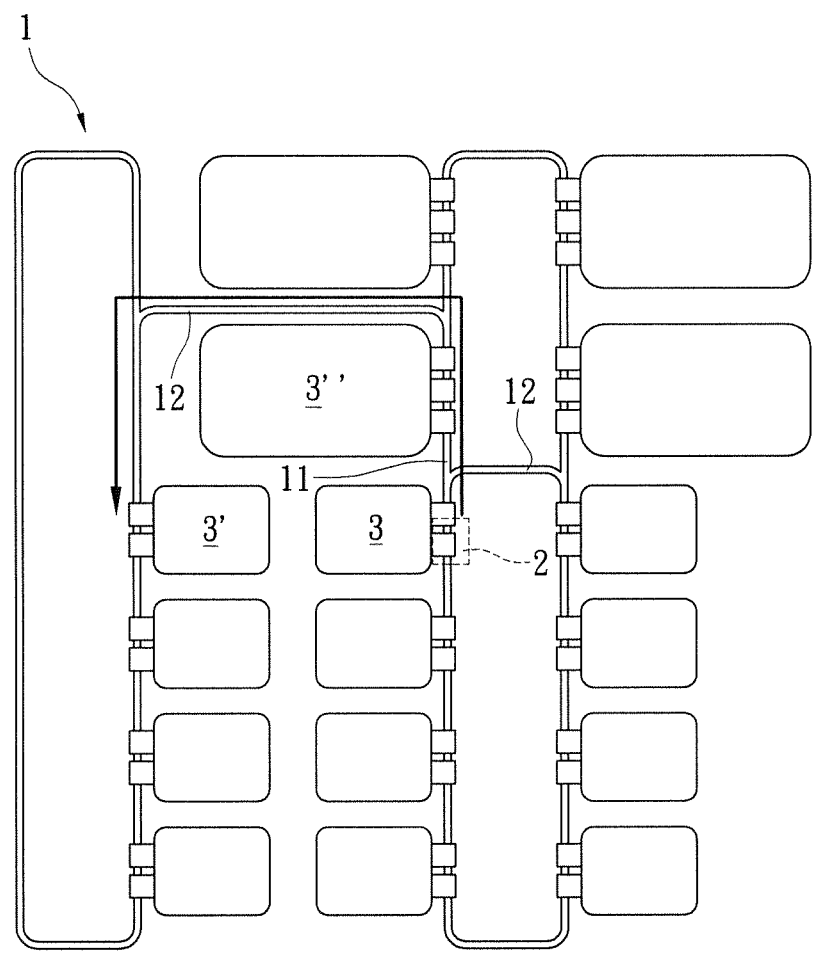
FIG. 1A is a diagram illustrating the schematic view of the wafer transport system known through prior art.
Figure 1B:
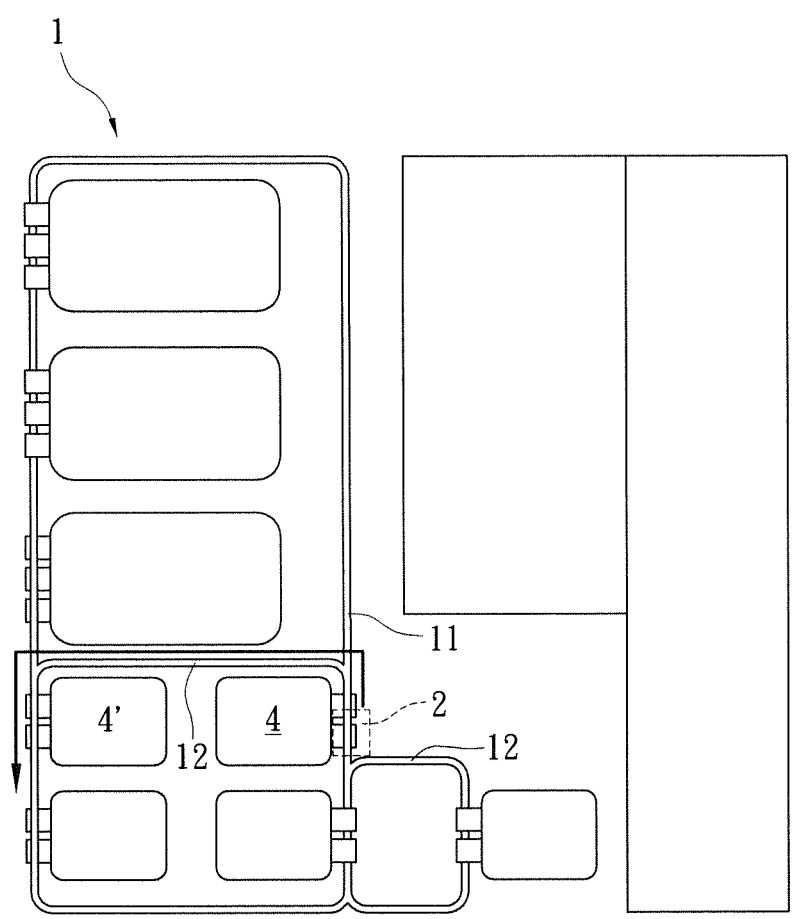
FIG. 1B is a diagram illustrating the schematic view of another wafer transport system known through prior art.
Figure 1C:
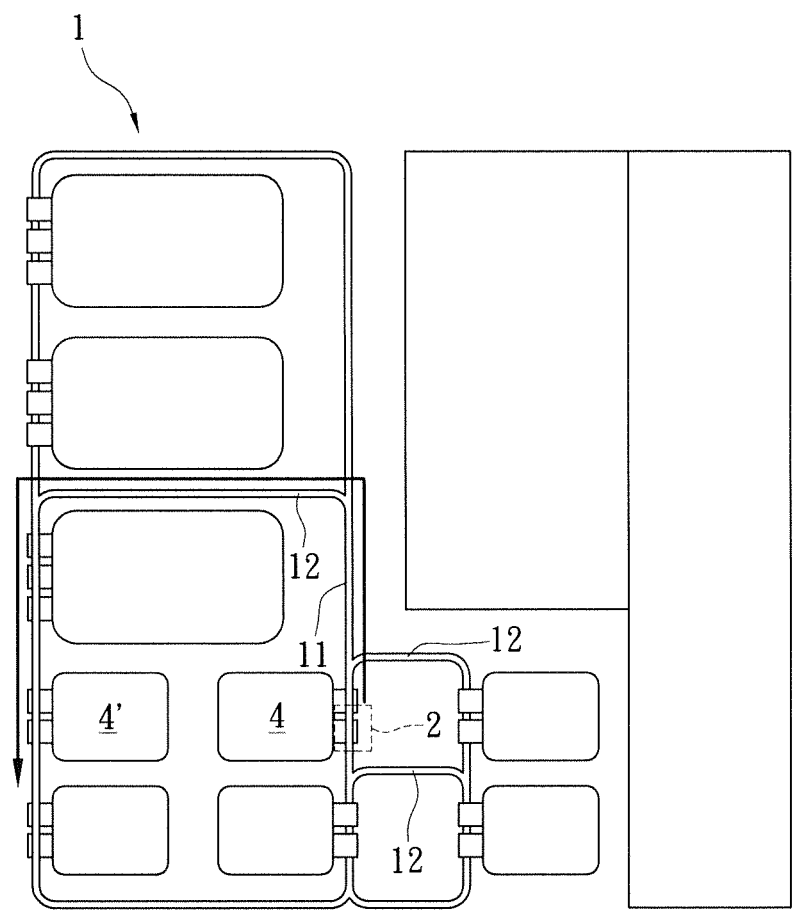
FIG. 1C is a diagram illustrating the schematic view of one more wafer transport system known through prior art.
Figure 2A:
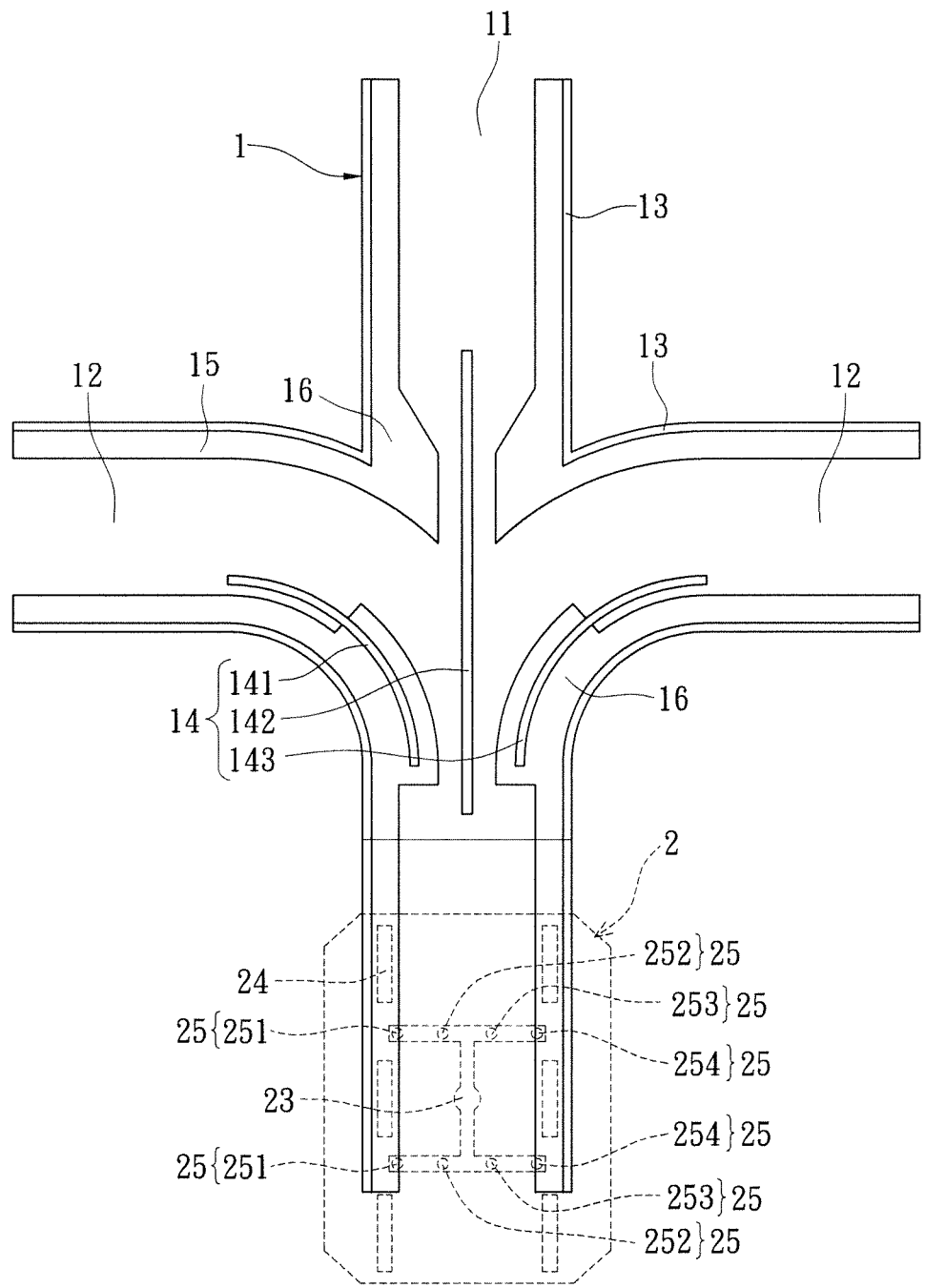
FIGS. 2A, 2B and 2C are diagrams illustrating the schematic view of the wafer transport system when operating (left turn), according to an embodiment of the present invention.
Figure 3:
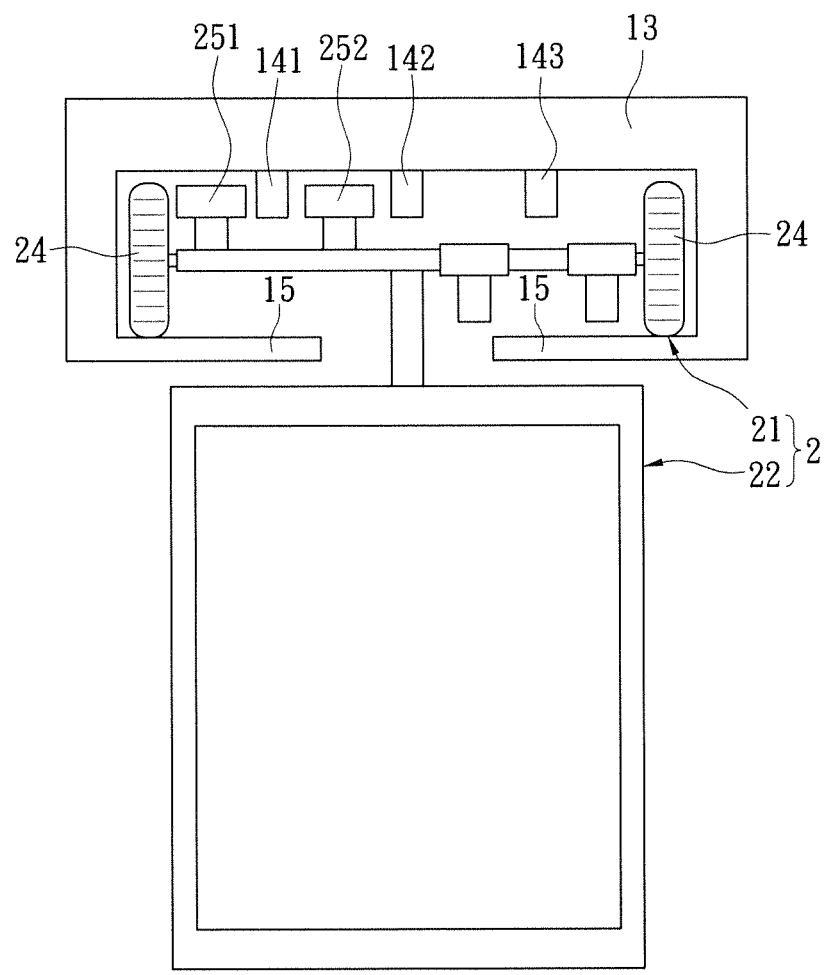
FIG. 3 is a diagram illustrating the cross-section of the OHT rail (left turn), according to an embodiment of the present invention.

Referring now to FIG. 2A & FIG. 3, the overhead wafer transport system of the present invention comprises an OHT rail 1 and a shuttle 2 traveling along the OHT rail 1, the OHT rail 1 includes a main track 11 and two lateral tracks 12, each having a hollow transverse cross-section, each lateral track 12 being in corresponding connection with the main track 11 through the two sides thereof, constituting an approximate tri-directional branch form. The shuttle 2 has a track-interface assembly 21 and a docking unit 22. The track-interface assembly 21 being adapted to travel along the OHT rail 1 and is adapted to selectively travel along at least one of the main track 11 and the lateral tracks 12. The shuttle 2 uses apparatus such as overhead rail which is built near the ceiling of the clean room, allowing loads such as FOUP (a kind of front-opening container which is in common use, also known as Front Opening Unified Pod) to connect with the docking unit 22 and hence transported by shuttle 2 after receiving commands from a material control system (MCS).

Each of The main track 11 and the two lateral tracks 12 comprises a track frame 13, a guiding member 14 and a track section 15. The cross-section of the track frame 13 is substantially U-shaped and the guiding member 14 is fixedly arranged on the upper inner surface of the track frame 13, dividing this particular side into four equal parts. The lateral sides of the track frame 13 extend to form the track section 15 wherein the track section 15 and the frame 13 is used to receive the track-interface assembly 21. The guiding member 14 guides the track-interface assembly 21 to selectively travel along one of the main track 11 and the lateral tracks 12, in addition, the main track 11 and the track section 15, the track section of the two lateral tracks 12, meet and extend, forming a reinforced section 16, enhancing the stability of the track-interface assembly 21 whenever a direction changes during travel.

The track-interface assembly 21 comprises a frame structure 23, three pairs of main wheels 24 and four pairs of branching wheels 25. The frame structure 23 is substantially H-shaped and includes a vertical bar coupled between two horizontal bars. The two horizontal bars split the inner space of the track-interface assembly 21 into three regions where the three pairs of wheels 24 are arranged within the two inner sides of the three regions respectively, enabling the track-interface assembly 21 to slide on the OHT rail 1. The aforementioned four branching wheels 25 are correspondingly arranged on the two horizontal bars with a predetermined distance in between, allowing the track-interface assembly 21 to selectively travel along one of the main track 11 and the lateral tracks 12.

Figure 2B:
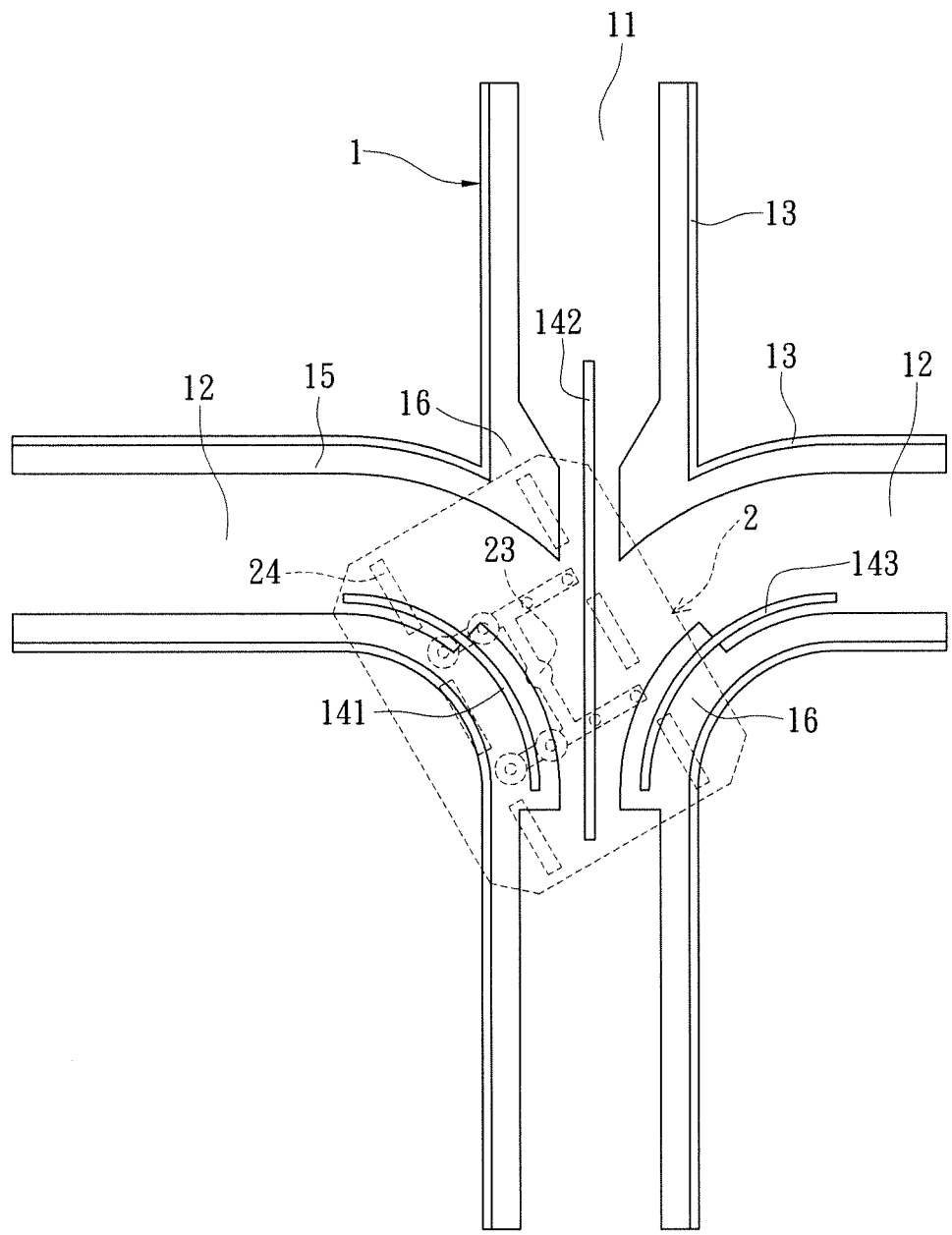
Figure 2C:
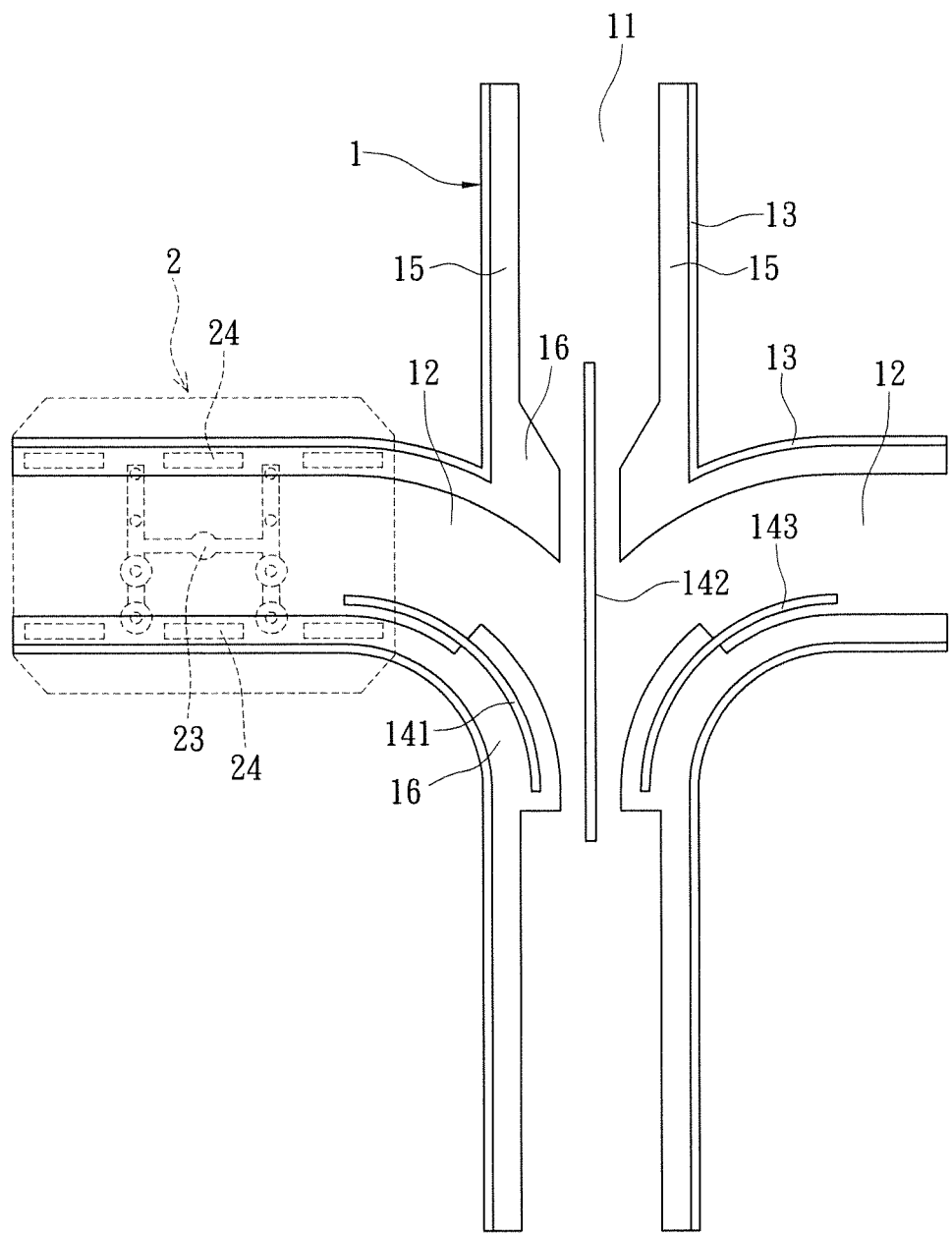

Referring now to FIGS. 2A to 2C which disclose the shuttle 2 traveling along the main track 11 and changes its direction to the lateral tracks 12. When the first pair of branching wheels 251 and the second pair of branching wheels 252 rise (as shown in FIG. 3), the track-interface assembly 21 will then travel along the first guiding member 141 and the shuttle 2 will change its direction, transporting the FOUP from the main track 11 to one of the lateral tracks 12 once it receives commands from the MCS.

Figure 4:
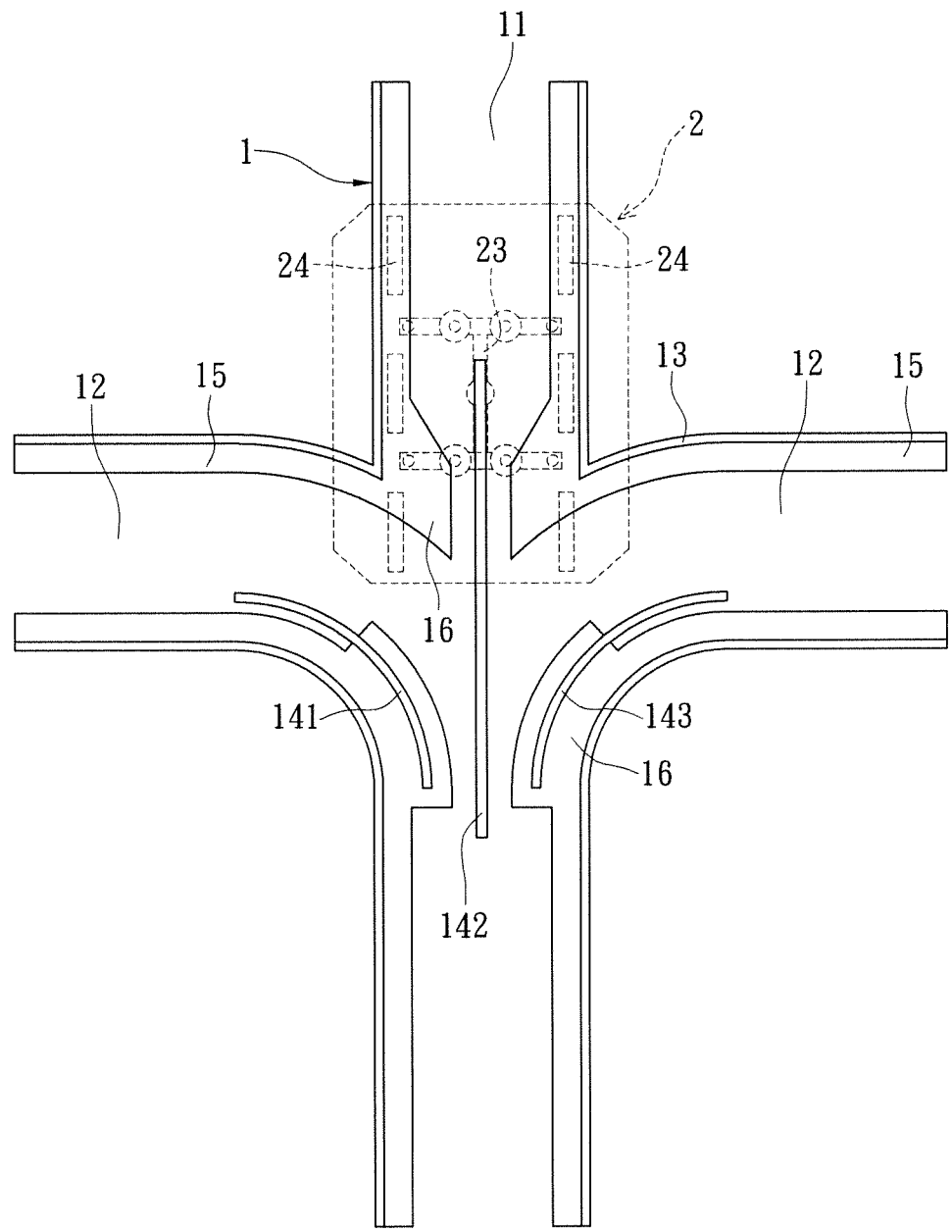
FIG. 4 is a diagram illustrating the schematic view of the wafer transport system when operating (straight going), according to an embodiment of the present invention.
Figure 5:
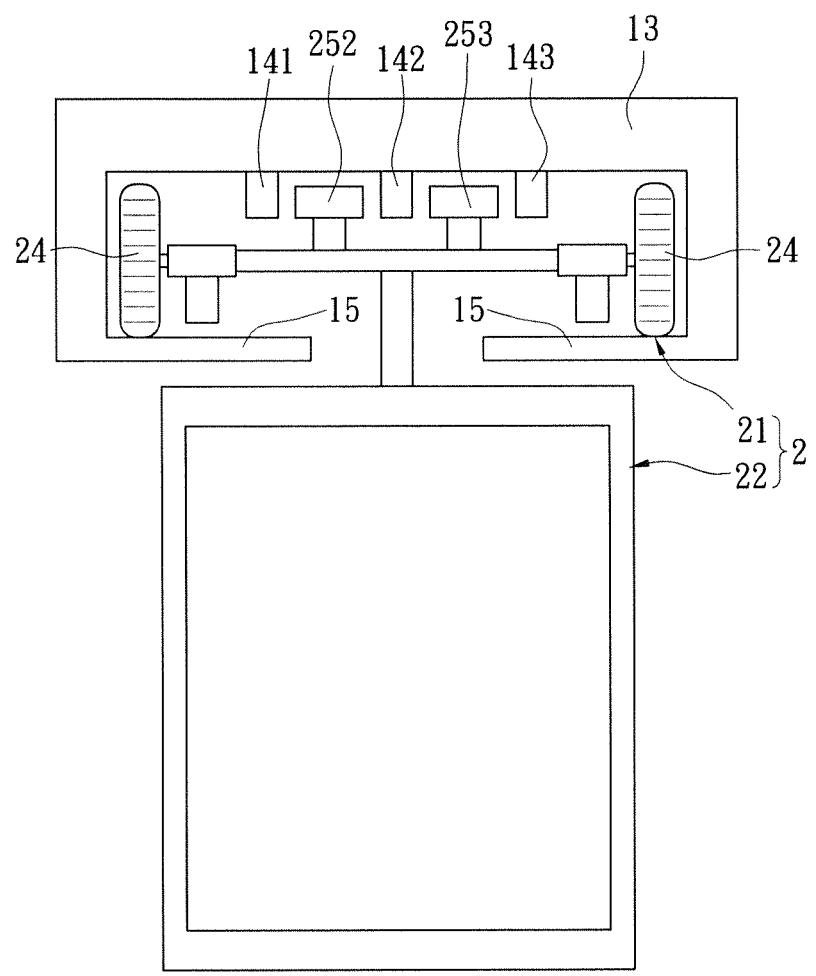
FIG. 5 is a diagram illustrating the cross-section of the OHT rail (straight going), according to an embodiment of the present invention.

Referring now to FIG. 2A & FIG. 4 which disclose the shuttle 2 traveling along the main track 11. When the second pair of branching wheels 252 and the third pair of branching wheels 253 rise (as shown in FIG. 5), the track-interface assembly 21 will then travel along the second guiding member 142, allowing the shuttle 2 to remain in the same direction, transporting the FOUP along the main track 11 once it receives commands from the MCS.

Figure 6A:
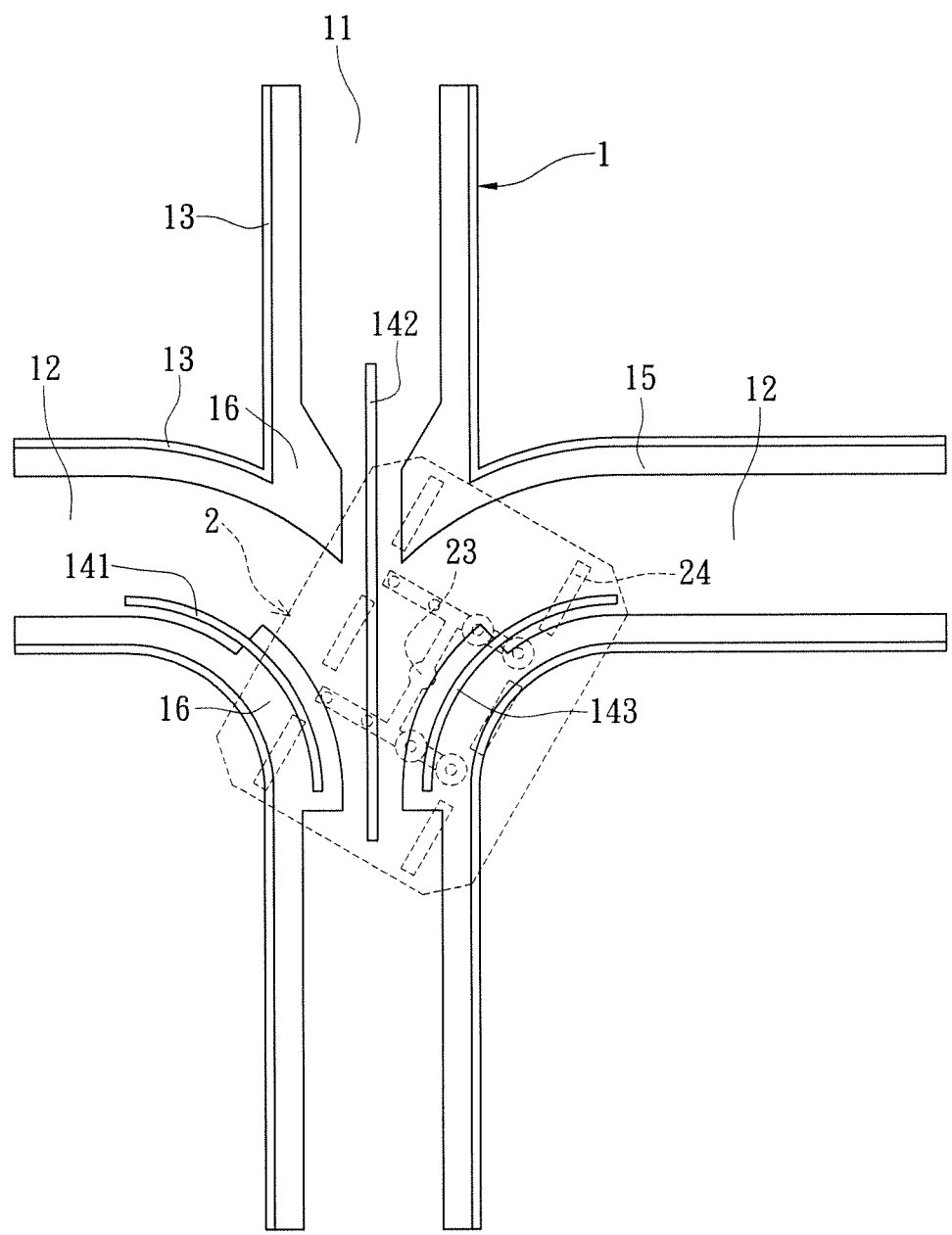
FIGS. 6A and 6B are diagrams illustrating the schematic view of the wafer transport system when operating (right turn), according to an embodiment of the present invention.
Figure 6B:
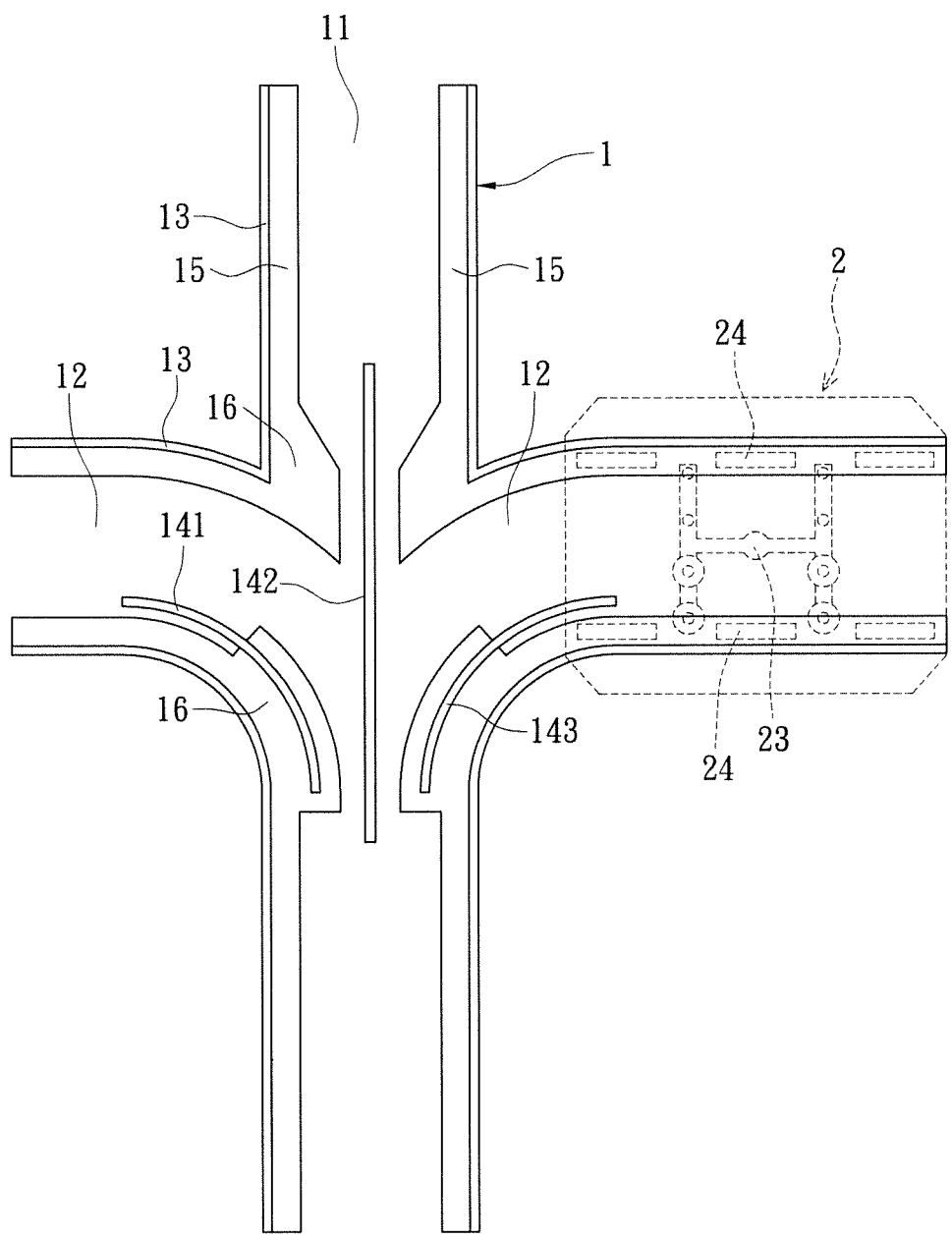
Figure 7:
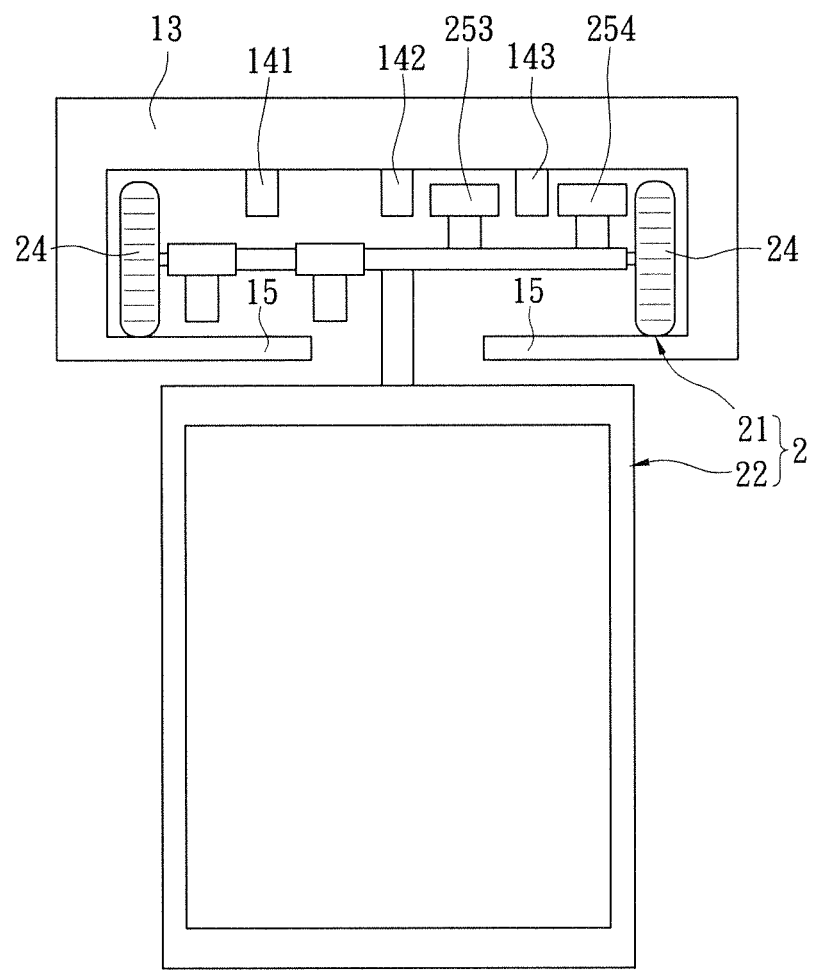
FIG. 7 is a diagram illustrating the cross-section of the OHT rail (right turn), according to an embodiment of the present invention.

In addition, referring now to FIG. 2A, FIG. 6A & FIG. 6B which disclose the shuttle 2 changing its direction to the lateral track 12. When the third pair of branching wheels 253 and the fourth pair of branching wheels 254 rise (as show in FIG. 7), the track-interface assembly 21 will then travel along the third guiding member 143 and the shuttle 2 will change its direction, transporting the FOUP from the main track 11 to another lateral track 12 once it receives commands from the MCS.

Second Implementation Example

Figure 8:
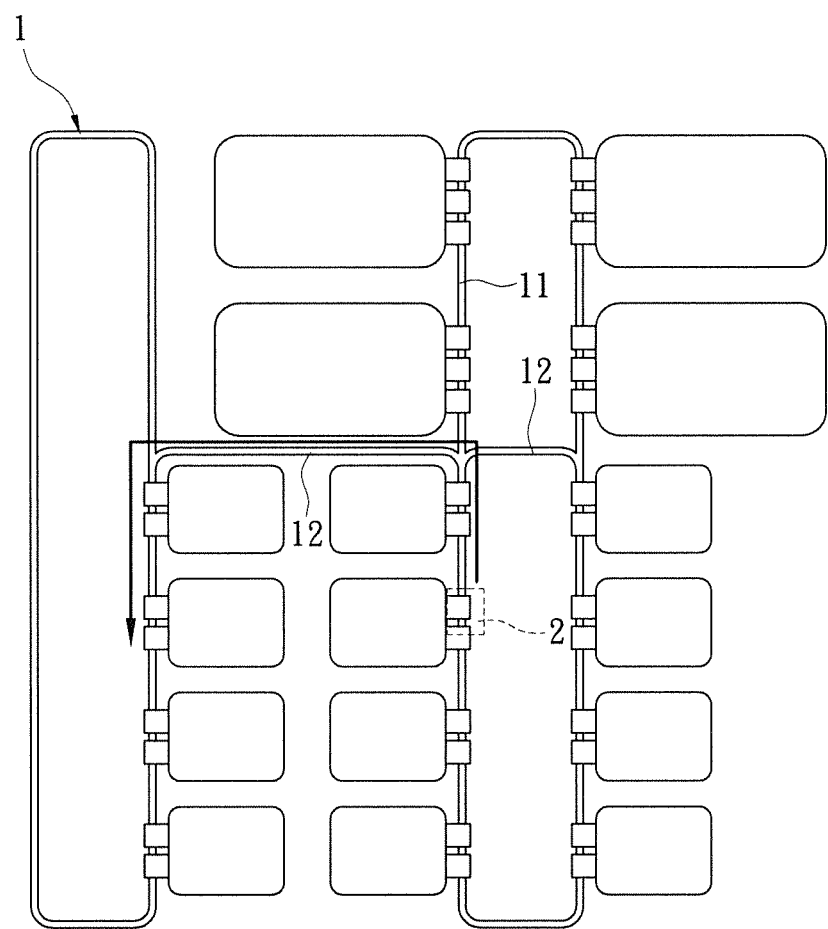
FIG. 8 is a diagram illustrating the plane view, according to the second embodiment of the present invention.

Referring now to FIG. 8 which is the situation practical application of the present invention. The wafers will be transported to different production units during different stages, using the present invention which comprises a rail segment similar to a tri-directional branch form that can connect the two lateral tracks respectively to the two corresponding sides of the main track 11, allowing the shuttle 2 to transport the wafers to the destination without going round the production tool, improving the transportation efficiency of the wafers.

Third Implementation Example

Figure 9:
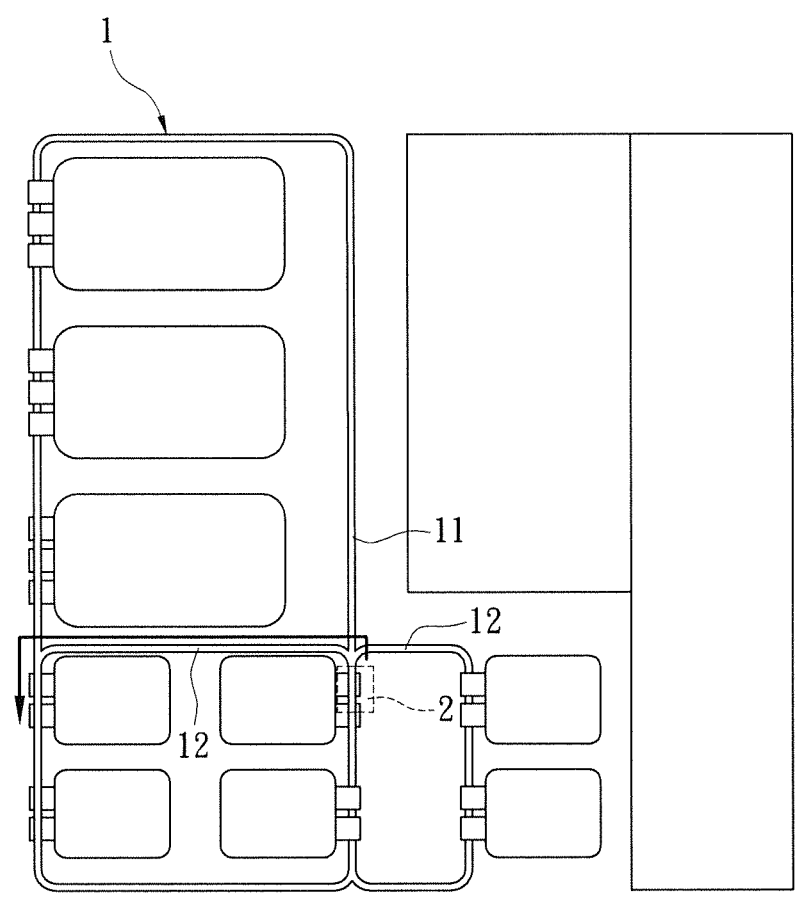
FIG. 9 is a diagram illustrating the plane view, according to the third embodiment of the present invention.

Referring now to FIG. 9, another implementation example of the present invention which discloses a situation where tracks and production tools are needed to be positioned in a very limited clean room space. In comparison to the prior arts, the overhead wafer transport system in the present invention acquires a rail segment which is similar to a tri-directional form; the semi-conductor fab can increase a production tool according to its needs. In addition, using the present invention can also achieve better clean room space utilization.

In conclusion, the present invention, overhead wafer transport system, can achieve higher transfer efficiency, clean room space utilization and a better design of arranging the tracks and the production tools henceforth increase the productivity of the semi-conductor fabs.

The descriptions illustrated supra set forth simply the preferred embodiments of the present invention; however, the characteristics of the present invention are by no means restricted thereto. All changes, alternations, or modifications conveniently considered by those skilled in the art are deemed to be encompassed within the scope of the present invention delineated by the following claims.

What is claimed is:

1. An overhead wafer transport system comprising:
 an overhead transportation (OHT) rail including a main track and two lateral tracks, each having a hollow transverse cross-section, each lateral track being in corresponding connection with the main track through the two respective sides thereof; and
 a shuttle having a track-interface assembly and a docking unit, wherein the track-interface assembly is adapted to travel along the OHT rail and includes a frame structure, three pairs of main wheels and four pairs of branching wheels, wherein the frame structure is substantially H-shaped and includes a vertical bar coupled between two horizontal bars;
 wherein the four pairs of branching wheels are correspondingly arranged on the two horizontal bars with a predetermined distance in between;
 wherein when the shuttle travels toward a junction of the two lateral tracks and the main track, the track-interface assembly is adapted to selectively travel along at least one of the main track and the lateral tracks.

2. The overhead wafer transport system according to claim 1, wherein each of the main track and the two lateral tracks comprises a track frame, a guiding member and a track section.

3. The overhead wafer transport system according to claim 2, wherein the connecting junction of the main track and the two lateral tracks forms an extended reinforced section.

4. The overhead wafer transport system according to claim 2, wherein the cross-section of the track frame is substantially U-shaped.

5. The overhead wafer transport system according to claim 2, wherein the guiding member is fixedly arranged on the upper inner surface of the track frame.

6. The overhead wafer transport system according to claim 4, wherein the lateral sides of the track frame extend to form the track section.

7. The overhead wafer transport system according to claim 1, wherein three pairs of wheels are adapted in the hollow portion of the tracks and configured to selectively travel along the main track and the lateral tracks on the track section thereof.

* * * * *